(12) United States Patent
Ikuta

(10) Patent No.: US 8,049,248 B2
(45) Date of Patent: Nov. 1, 2011

(54) SEMICONDUCTOR DEVICE INCLUDING THYRISTOR AND METHOD OF MANUFACTURING THE SAME

(75) Inventor: Tetsuya Ikuta, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 12/277,838

(22) Filed: Nov. 25, 2008

(65) Prior Publication Data

US 2009/0159926 A1   Jun. 25, 2009

(30) Foreign Application Priority Data

Dec. 19, 2007   (JP) ................. 2007-326967

(51) Int. Cl.
*H01L 21/332* (2006.01)
(52) U.S. Cl. ......... 257/133; 257/E21.388; 257/E27.079; 257/E29.211; 257/E29.214; 257/E29.295; 438/135
(58) Field of Classification Search .......... 257/133, 257/157, E21.388, 21.389, E27.079 E29.037, 257/E29.047, E29.048, E29.211, E29.214, 257/E29.295; 438/135

See application file for complete search history.

(56) References Cited

U.S. PATENT DOCUMENTS

| 6,462,359 B1 | 10/2002 | Nemati et al. |
| 6,888,176 B1 | 5/2005 | Horch et al. |
| 2007/0138501 A1* | 6/2007 | Sugizaki et al. ............. 257/107 |

OTHER PUBLICATIONS

Nemati et al., "A novel High Density, Low Voltage SRAM Cell with a Vertical NDR Device", 1998 IEEE, VLSI Technology tech. Dig. p. 66, 1998.
Nemati et al., "A Novel Thyristor-based SRAM Cell (T-RAM) for High-Speed. Low-Voltage, Giga-scale Memories", 1999 IEEE IEDM Tech., 183, 1999.
Nemati et al., "Fully Planar 0.5621μm2 T-RAM Cell in a 130nm SOI CMOS Logic Technology for High-Density High-Performance SRAMs", T-RAM Inc., IEEE 2004.

* cited by examiner

*Primary Examiner* — Benjamin Sandvik
*Assistant Examiner* — Farid Khan
(74) *Attorney, Agent, or Firm* — Robert J. Depke; Rockey, Depke & Lyons, LLC

(57) ABSTRACT

A semiconductor device includes a thyristor in which a first-conductivity-type first region, a second-conductivity-type second region having a conductivity type reverse to the first conductivity type, a first-conductivity-type third region, and a second-conductivity-type fourth region are sequentially arranged to form junctions. The third region is formed on a semiconductor substrate separated by an element isolation region. A gate electrode formed via a gate insulating film and side wall formed at wall side of both side of the gate electrode are provided on the third region, and the fourth region is formed so that one end thereof covers the joint portion between the other end of the third region and the element isolation regions, and so that the other end of the fourth region is joined with the sidewall on the other side.

7 Claims, 6 Drawing Sheets

SEMICONDUCTOR DEVICE INCLUDING THYRISTOR AND METHOD OF MANUFACTURING THE SAME

The present invention contains subject matter related to Japanese Patent Application JP 2007-326967 filed in the Japanese Patent Office on Dec. 19, 2007, the entire contents of which are incorporated herein by reference.

FIELD OF THE INVENTION

The present invention relates to a semiconductor device using a thyristor, and a method of manufacturing the same.

DESCRIPTION OF THE RELATED ART

There has been proposed a memory (in particular, for SRAM) configured by using a thyristor, allowing a gate electrode formed on the thyristor to control turn-on/turn-off characteristics of the thyristor, and being connecting with an access transistor in series (referred to as T-RAM, hereinafter). The memory operates while assuming the OFF region of the thyristor as "0", and the ON region as "1".

The thyristor is basically composed by sequentially joining a first p-type region p1, a first n-type region n1, a second p-type region p2, and a second n-type region n2 basically to form a 4-layer structure of n-type silicon and p-type silicon, for example.

The basic structure will be expressed as p1/n1/p2/n2, hereinafter. Two types of structures have been proposed by T-RAM, Inc.

One of them has the p1/n1/p2/n2 structure configured vertically on a silicon substrate.

The other has the p1/n1/p2/n2 structure configured laterally on a silicon layer, by using an SOI substrate.

In any configurations, high-speed operation is enabled, by providing a gate electrode having an MOS structure on "p2" in the n1/p2/n2 structure [see Farid Nemati and James D. Plummer, "A Novel High Density, Low Voltage SRAM Cell with a Vertical NDR Device" 1998 IEEE, VLSI Technology Tech. Dig., p. 66, 1998 (Non-Patent Document 1), Farid Nemati and James D. Plummer, "A Novel Thyristor-based SRAM Cell (T-RAM) for High-Speed, Low-Voltage, Giga-scale Memories", 1999 IEEE IEDM Tech., p. 283, 1999 (Non-Patent Document 2), Farid Nemati, Hyun-Jin Cho, Scott Robins, Rajesh Gupta, Marc Tarabbia, Kevin J. Yang, Dennis Hayes, and Vasudevan Gopalakrishnan, "Fully Planar 0.562 $\mu m^2$ T-RAM Cell in a 130 nm SOI CMOS Logic Technology for High-Density High-Performance SRAMs", 2004 IEEE IEDM Tech., p. 273, 2004 (Non-Patent Document 3), and U.S. Pat. No. 6,462,359 (B1) (Patent Document 1), for example].

The applicant of the present invention and T-RAM, Inc. have proposed manufacturing methods using selective epitaxial growth technique [see U.S. Pat. No. 6,888,176 (B1) (Patent Document 2), for example].

For example, as shown in FIG. 6, there has been proposed a method of forming the first p-type region p1 and the first n-type region n1 by selective epitaxial growth, in order to ensure a large process margin of the first p-type region p1 and the first n-type region n1.

Similarly in order to ensure a process margin, there has been proposed also a method of forming the second n-type region n2 by selective epitaxial growth.

In order to form the first p-type region p1 and the first n-type region n1 by selective epitaxial growth, it is required to suppress short-circuiting between the first p-type region p1 and the second p-type region p2.

Similarly, in order to form the second n-type region n2 by selective epitaxial growth, it is required, in the process of forming a metal silicide layer 26 on the surface of the second n-type region n2, to suppress short-circuiting between the second n-type region n2 and the second p-type region p2 caused via the metal silicide layer 26.

However, in the case of forming the first n-type region n1 and the second n-type region n2 on the second p-type region p2 by selective epitaxial growth, there is a case that the growth may not proceed outwardly beyond the underlying silicon substrate region, that is, onto the element isolation region 13.

If the metal silicide layer 26 is formed on the surface of the second n-type region n2, the metal silicide layer 26 may be brought into contact with the second p-type region p2, and comes to induce short-circuiting between the second n-type region n2 and the second p-type region p2 caused via the metal silicide layer 26.

Further, if the first p-type region p1 is formed on the first n-type region n1 by selective epitaxial growth in which the first p-type region p1 is formed, with a state that the first n-type region n1 is formed, the first p-type region p1 and the second p-type region p2 may be brought into contact at the hem portion of the first n-type region n1, because the film thickness of the first n-type region n1 is thinned at the facet region thereof, and the short-circuiting may occur.

If the short-circuiting occurs between the second n-type region n2 and the second p-type region p2 caused via the metal silicide layer 26, or between the first p-type region p1 and the second p-type region p2, the p1/n1/p2/n2 junction may simply be equivalent to a mere p-n junction, therefore, it becomes difficult to obtain the thyristor characteristics, and the structure becomes difficult to be operable as a memory.

Therefore, it is necessary to physically bring the metal silicide layer 26 away from the second p-type region p2, or bring the first p-type region p1 away from the second p-type region p2, so as to prevent the short-circuiting.

The subject to be solved herein is that, if the metal silicide layer is formed on the surface of the second n-type region, the short-circuiting may occur between the metal silicide layer and the second p-type region.

It is therefore an object of the present invention to provide a technique of preventing short-circuiting between the second n-type region and the second p-type region, even if the metal silicide layer is formed on the surface of the second n-type region.

SUMMARY OF THE INVENTION

According to an embodiment of the present invention, there is provided a semiconductor device which contains a thyristor composed of a first-conductivity-type first region, a second-conductivity-type second region having a conductivity type reverse to the first conductivity type, a first-conductivity-type third region, and a second-conductivity-type fourth region sequentially arranged to form junctions. The third region is formed on the semiconductor substrate which is separated by an element isolation region, and includes a gate electrode formed on the third region while placing a gate insulating film in between and sidewalls formed on both side faces of the gate electrode. The fourth region is formed so that one end thereof covers the joint portion between the other end of the third region and the element isolation region, and so that the other end of the fourth region comes into contact with the sidewall on the other side.

In the semiconductor device of the present invention, on end of the fourth region covers the joint portion between the other end of the third region and the element isolation region, and other end of the fourth region comes into contact with the sidewall on the other side. Accordingly, even if the silicide layer is formed on the surface side of the fourth region, short-circuiting with the third region is not likely to be caused, because the silicide layer is formed such that the fourth region covers above the joint portion between the other end side of the third region and the element isolation region.

According to an embodiment of the present invention, there is provided also a method of manufacturing a semiconductor device having, as being formed therein, a thyristor composed of a first-conductivity-type first region, a second-conductivity-type second region having a conductivity type reverse to the first conductivity type, a first-conductivity-type third region, and a second-conductivity-type fourth region sequentially arranged to form junctions. The method includes a step of forming an element isolation region in a semiconductor substrate, a step of forming the third region in the semiconductor substrate partitioned by the element isolation region, a step of forming a gate electrode on the third region while placing a gate insulating film in between, and forming sidewalls on both side faces of the gate electrode, a step of forming the second region on a portion of the third region on one side of the gate electrode, a step of forming the first region on the second region, and a step of forming the fourth region on a portion of the third region on the other side of the gate electrode. In the step of forming the fourth region, the fourth region is formed so that one end thereof covers the joint portion between the other end of the third region and the element isolation region, and so that the other end of the fourth region comes into contact with the sidewall on the other side.

In the method of manufacturing a semiconductor device of an embodiment of the present invention, the fourth region is formed so as to cover the joint portion between the other end of the third region and the element isolation region with one end thereof, and so that the other end thereof comes into contact with the sidewall on the other side. Accordingly, even if the silicide layer is formed on the surface of the fourth region, short-circuiting between the silicide layer and the third region is not tend to be caused because the joint portion between the other side of the third region and the element isolation region is covered by the fourth region.

According to the semiconductor device of an embodiment of the present invention, the fourth region covers the joint portion between the other end of the third region and the element isolation region, therefore the silicide layer, even if formed on the surface of the fourth region, will never cause short-circuiting with the third region.

As a consequence, the junction between the third region and the fourth region can properly function, and this raises a merit of obtaining a semiconductor device ensuring normal thyristor characteristics.

According to the method of manufacturing a semiconductor device of an embodiment of the present invention, the fourth region is formed to cover the joint portion between the other end of the third region and the element isolation region, therefore, even if the silicide layer is formed on the surface of the fourth region, short-circuiting between the silicide layer and the third region is not tend to be caused.

As a consequence, the third region and the fourth region may be formed so that the junction therebetween can function, and this raises a merit of manufacturing a semiconductor device ensuring normal thyristor characteristics.

DETAILED DESCRIPTION OF THE EMBODIMENTS

One embodiment (Example) of the semiconductor device of an embodiment of the present invention will be explained by referring to FIG. 1 as a schematic sectional view showing a configuration, and FIG. 2 as a plan view showing a layout.

Figure 1:
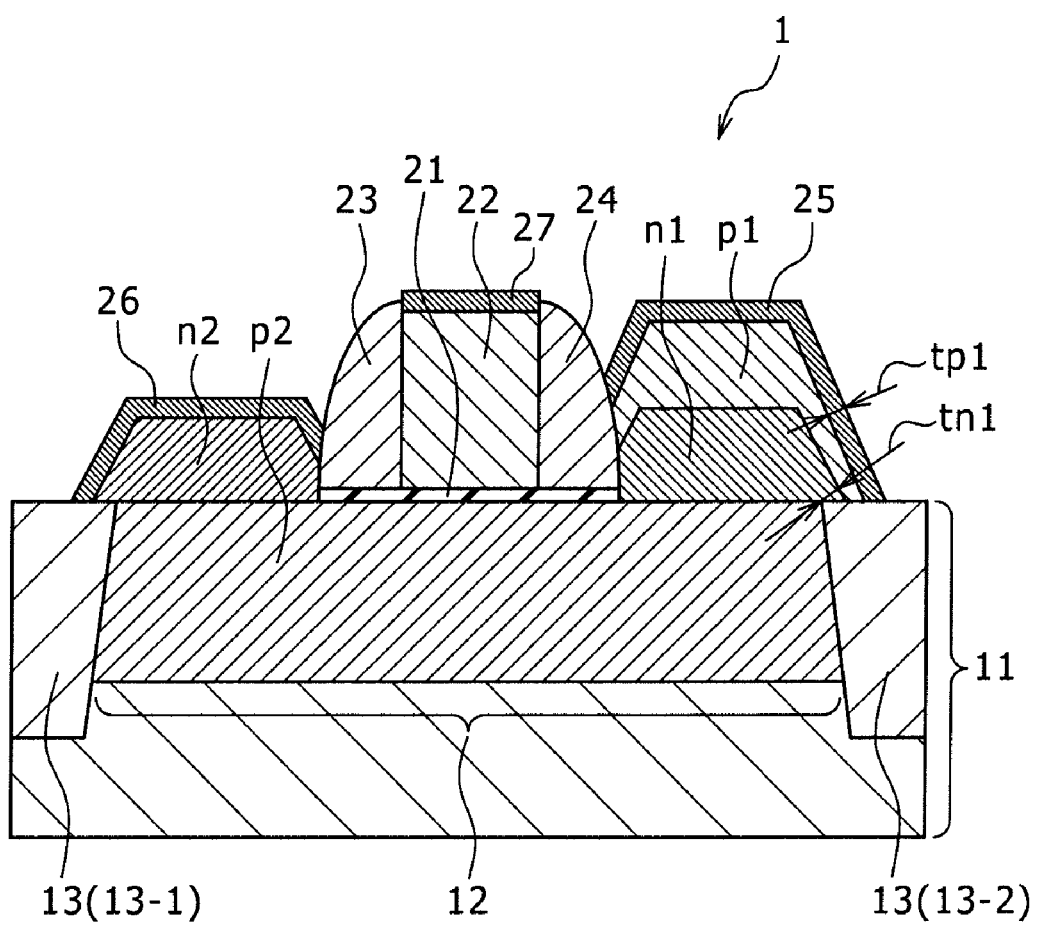
FIG. 1 is a schematic sectional view showing a configuration of one embodiment (Example) of the semiconductor device of the present invention.
Figure 2:
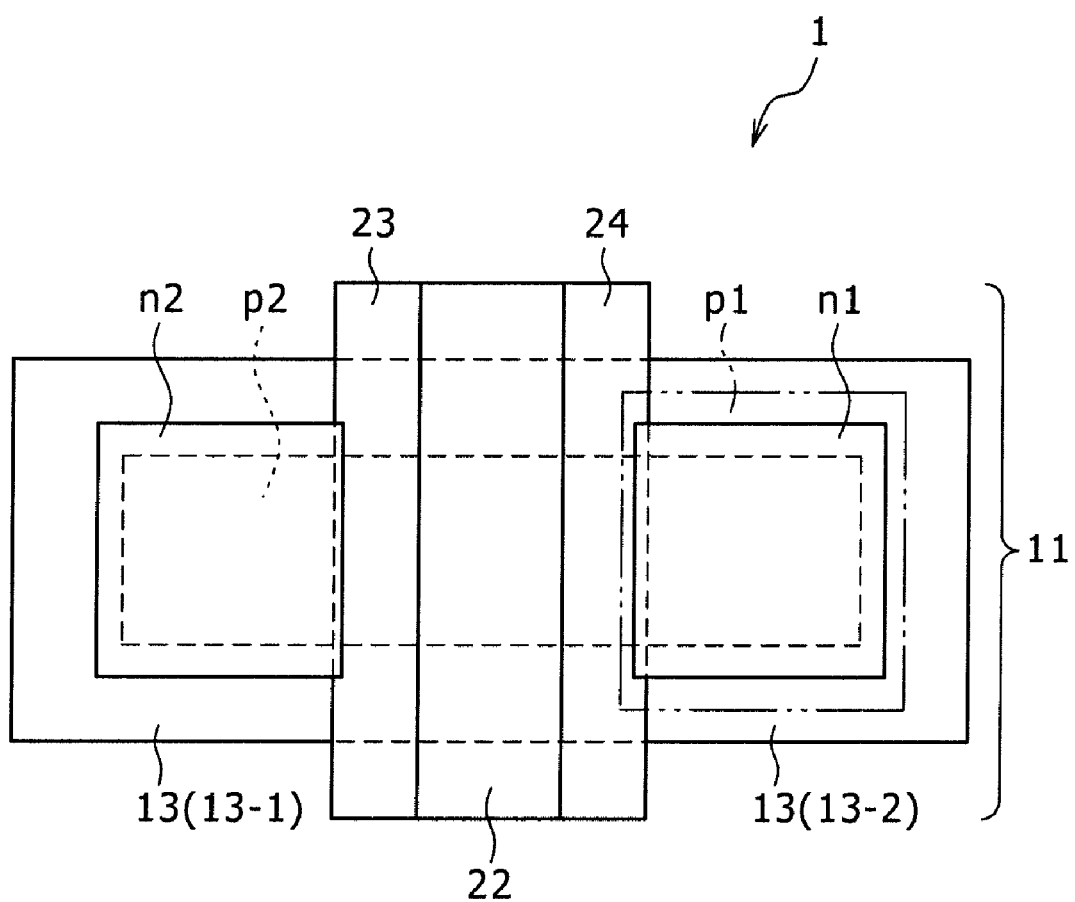
FIG. 2 is a plan view showing a layout of one embodiment (Example) of the semiconductor device of the present invention.

As shown in FIG. 1 and FIG. 2, an element isolation region 13 for partitioning an element-forming region 12 in which a thyristor T1 is formed, are formed on a semiconductor substrate 11. A silicon substrate may typically be used for the semiconductor substrate 11. The element isolation regions 13 are formed using a technique such as LOCOS (local oxidation of silicon), STI (shallow trench isolation), DTI (deep trench isolation) or the like.

On and above the element-forming region 12, there is formed a semiconductor device 1 composed of a thyristor T1, having a first p-type region p1 (first region) having a first conductivity type (p-type), a first n-type region n1 (second region) having a second conductivity type (n-type) reverse to the first conductivity type, a second p-type region p2 (third region) having a first conductivity type (p-type), and a second n-type region n2 (fourth region) having a second conductivity type (n-type), sequentially arranged to form junctions.

The first conductivity type and the second conductivity type, explained hereinafter respectively as being p-type and n-type, may be reversed, so that the first conductivity type may stand for n-type, and the second conductivity type may stand for p-type.

Details will be explained below.

Below the element-forming region 12, an n-well region (not shown) for example may be formed. In the upper portion of the element-forming region 12 of the semiconductor substrate 11, there is formed a first conductivity type (p-type) region. This p-type region configures the second p-type region p2 (third region) of the thyristor.

The second p-type region p2 is formed by doping (ion implantation, solid phase diffusion, or the like) boron (B) into the semiconductor substrate 11 to as much as a concentration of $5 \times 10^{18}$ cm$^{-3}$ for example, preferably $1 \times 10^{18}$ cm$^{-3}$ to $1 \times 10^{19}$ cm$^{-3}$ or around. Basically, the dopant concentration herein must be smaller than that of the second conductivity type (n-type) first n-type region n1 explained later.

Besides boron (B), any other p-type dopant such as indium (In) may be adoptable. The concentration obtained by adopting indium is equivalent to the concentration obtained by adopting boron.

On the semiconductor substrate 11, a gate insulating film 21 is formed. The gate insulating film 21 is typically composed of a silicon oxide ($SiO_2$) film, formed to have a thickness of around 1 nm to 10 nm.

Material composing the gate insulating film 21 is not limited to silicon oxide ($SiO_2$), but includes not to mention silicon oxinitride (SiON), but also materials discussed for adoption to gate insulating film in general CMOS, such as hafnium oxide ($HfO_2$), hafnium oxinitride (HfON), alumina ($Al_2O_3$), hafnium silicate (HfSiO), hafnium silicon nitride (HfSiON) and lanthanum oxide ($La_2O_3$), may be used.

On the gate insulating film 21, a gate electrode 22 is formed. The gate electrode 22 is generally composed of polysilicon. The gate electrode 22 may also be a metal gate electrode, or may be formed by using silicon germanium (SiGe).

Alternatively, a silicon oxide ($SiO_2$) film, silicon nitride ($Si_3N_4$) film or the like may be formed as a hard mask on the gate electrode 22.

On the sidewall of the gate electrode 22, sidewalls 23, 24 are formed. The sidewalls 23, 24 may be formed using either of silicon oxide ($SiO_2$) and silicon nitride ($Si_3N_4$), and even a stacked film of them.

On one side of the gate electrode 22, the first n-type region n1 (second region) having a second conductivity type (n-type) is formed. The first n-type region n1 is formed so that one end thereof covers the joint portion between the one end of the second p-type region p2 and the element isolation region 13 (13-2), and so that the other end of the first n-type region n1 comes into contact with the one end of the sidewall 24.

Thus-configured first n-type region n1 is formed by an epitaxial growth layer epitaxially grown also in the lateral direction beyond the range of the second p-type region p2.

The first n-type region n1 has an n-type dopant concentration adjusted to $1.5\times10^{19}$ cm$^{-3}$, for example. The concentration preferably falls in the range from $1\times10^{18}$ cm$^{-3}$ to $1\times10^{21}$ cm$^{-3}$ or around, and it is required that the concentration is larger than the dopant concentration of the second p-type region p2, and that the concentration is smaller than that of the first p-type region p1 (first region) described in the next.

Phosphorus (P) may be used for the n-type dopant, and it is also possible that other n-type dopant such as arsenic, antimony or the like may be used instead of phosphorus. Concentration obtained by using the n-type dopant such as arsenic, antimony or the like may be equivalent to a concentration obtained by using phosphorus.

Film thickness of the first n-type region n1 preferably be a film thickness of, for example, epitaxial growth layer portion having a thickness around 50 nm to 300 nm.

The first n-type region n1 preferably has an effective film thickness not smaller than the sum of a depletion layer of the first n-type region n1 side generated at the interface between the first p-type region p1 and the first n-type region n1, and a depletion layer at the first n-type region n1 side generated at the interface between the first n-type region n1 and the second p-type region p2. In particular, the first n-type region n1 has a minimum film thickness tn1 measured from its contact point with the second p-type region p2 to a facet surface of the first n-type region n1, and the film thickness tn1 is at least not smaller than the above-described effective film thickness.

By setting the first n-type region n1 to have an effective film thickness as described in the above, generation of punch-through from the first p-type region p1 to the second p-type region p2 may be avoidable.

The setting is also advantageous in preventing short-circuiting between the first p-type region p1 and the second p-type region p2.

Moreover, a metal silicide layer 25 explained later is formed on the surface of the first p-type region p1. For this reason, in order to avoid short-circuiting between the first p-type region p1 and the first n-type region n1 caused via the metal silicide layer 25, for the first p-type region p1, film thickness tp1 in the foot portion on the facet surface of the n-type region n1, after the metal silicide layer 25 is formed, is ensured.

By virtue of this configuration, short-circuiting between the first p-type region p1 and the first n-type region n1 caused via the metal silicide layer 25 may be avoided.

Assuming now dielectric constant of the semiconductor (first n-type region n1) as $\epsilon_s$, charge as q, impurity concentration of acceptor as $N_A$, impurity concentration of donor as $N_D$, and built-in potential as $V_{bi}$, width W of the depletion layer may be expressed by the equation (1). The equation is typically known, as is disclosed for example in "Semiconductor Devices—Physics and Technology—", 2nd Ed., S. M. Sze, published by Sangyo Tosho Publishing Co., Ltd., p 76, published in 2004 (translated into Japanese).

$$W = \sqrt{\frac{2\varepsilon_s}{q}\left[\frac{N_A + N_D}{N_A N_D}\right] V_{bi}} \qquad (1)$$

On the first n-type region n1, the first conductivity type (p-type) first p-type region p1 (first region) is formed.

The first p-type region p1 is formed on the first n-type region n1, so that one end thereof is joined with the surface of the element isolation region 13 (13-2). The other end of the first p-type region p1 is joined with the flank of the sidewall 24.

The first p-type region p1 is typically composed of an epitaxial growth layer introducing a p-type dopant, and arranged such that the p-type dopant concentration is adjusted to be $1\times10^{20}$ cm$^{-3}$, for example. The p-type dopant concentration preferably falls in the range from $1\times10^{18}$ cm$^{-3}$ to $1\times10^{21}$ cm$^{-3}$ or around.

For the p-type dopant, boron (B) is used, but other p-type dopant, such as indium may be used instead. Concentration obtained by using other p-type dopant may be equivalent to a concentration obtained by using boron (B).

The film thickness is preferably be a film thickness of the epitaxial growth layer portion having a thickness around 50 nm to 300 nm, for example, and is not limited as long as in the range that the first p-type region p1 can function as an anode.

On the semiconductor substrate 11 (second p-type region p2) and on the other side of the gate electrode 22, the second n-type region n2 (fourth region) is formed.

The second n-type region n2 is composed of an epitaxially grown layer introducing an n-type dopant. Phosphorus (P) is typically used as the dopant, and the concentration is adjusted to be $5\times10^{20}$ cm$^{-3}$, for example. The concentration preferably falls in the range from $1\times10^{18}$ cm$^{-3}$ to $1\times10^{21}$ cm$^{-3}$ or around, but is necessarily to be larger than the dopant concentration of the second p-type region p2. The film thickness preferably falls in the range from 50 nm to 300 nm, as measured from the surface of the semiconductor substrate 11, but it is important that the second n-type region n2 have a film thickness functioning as a cathode.

As the n-type dopant, also other n-type dopant such as arsenic, antimony or the like may be used in place of phosphorus. Concentration obtained by using the n-type dopant, such as arsenic, antimony or the like may be equivalent to a concentration obtained by using phosphorus.

Metal silicide layers 25, 26, 27 are formed on the surface of the first p-type region p1, the surface of the second n-type region n2, and the gate electrode 22, for the purpose of lowering resistivity. Any metal silicide layer adopted to general MOS devices, such as titanium silicide, cobalt silicide, nickel silicide or the like, may be adoptable to the metal silicide layers 25, 26 and 27.

The second n-type region n2 excluding the portions where the metal silicide layer 26 is formed preferably has a film thickness of not smaller than a depletion layer of the second n-type region n2 side generated at the interface between the second n-type region n2 and the second p-type region p2.

The width of the depletion layer may be obtained by the equation (1) in the above.

By virtue of formation of the second n-type region n2, the short-circuiting between the second n-type region n2 and the second p-type region p2 may be avoidable.

In the semiconductor device 1, one end of the second n-type region n2 covers a joint portion between the other end of the second p-type region p2 and the element isolation region 13 (13-1), and the other end of the second n-type region n2 is joined with the flank of the sidewall 23. Accordingly, since above the joint portion between the other end of the second n-type region n2 and the element isolation region 13 (13-1) is covered by the second n-type region n2, even if the metal silicide layer 26 is formed on the surface side of the second n-type region n2, short-circuiting between the second n-type region n2 and the second p-type region p2 may be avoidable.

In addition, one end of the first n-type region n1 covers a joint portion between the one end of the second p-type region p2 and the element isolation region 13 (13-2), and the other end of the first n-type region n1 is joined with the flank of the sidewall 24. Thus, above the joint portion between the one end of the second p-type region p2 and the element isolation region 13 (13-2) is covered by the first n-type region n1, even if the first p-type region p1 is formed so as to extend as far as on the element isolation region 13 (13-2). Because the first p-type region p1 and the second p-type region p2 are kept apart by the first n-type region n1 and the element isolation region 13 (13-2), short-circuiting between the first p-type region p1 and the second p-type region p2 may be avoidable.

Moreover, the first n-type region n1 is formed so as to have an effective thickness not smaller than the sum of a depletion layer of the first n-type region n1 side generated at the interface between the first p-type region p1 and the first n-type region n1, and a depletion layer of the first n-type region n1 side generated at the interface between the first n-type region n1 and the second p-type region p2. Accordingly, generation of punch-through from the first p-type region p1 to the second p-type region p2 may be avoidable.

Therefore, under the thyristor, having the first p-type region p1 (first region), the first n-type region n1 (second region), the second p-type region p2 (third region) and the second n-type region n2 (fourth region) sequentially arranged to form junctions, the junction between the first p-type region p1 and the first n-type region n1, the junction between the first n-type region n1 and the second p-type region p2, and the junction between the second p-type region p2 and the second n-type region n2 can function, and normal thyristor characteristics may be obtained.

Figure 4A:
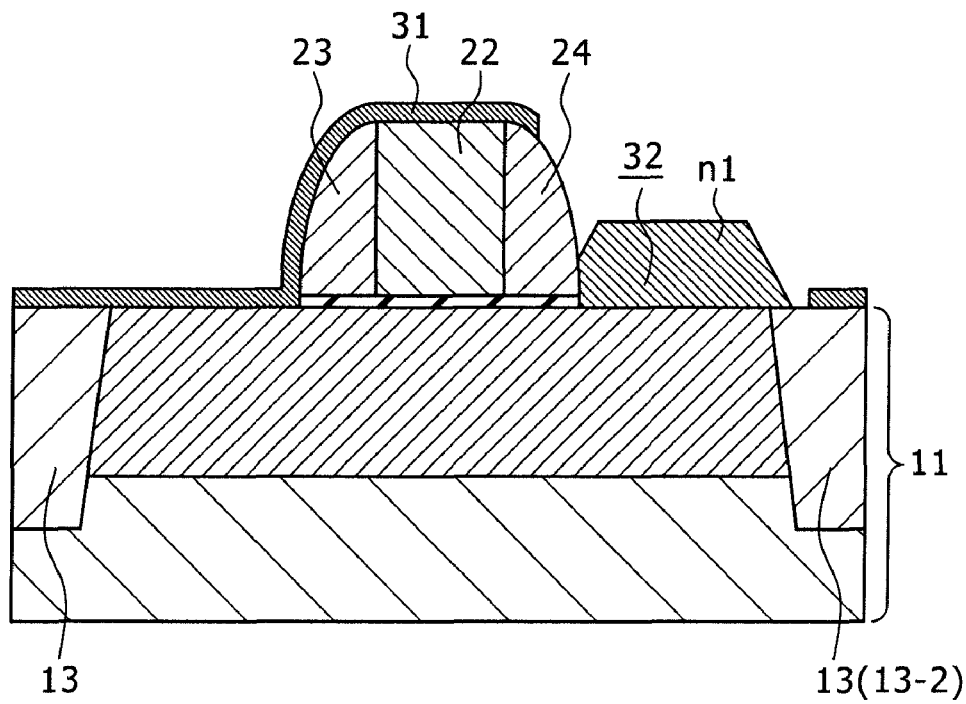
FIGS. 4A, 4B are sectional views showing steps of one embodiment (Example) of the method of manufacturing the semiconductor device of the present invention.
Figure 4B:
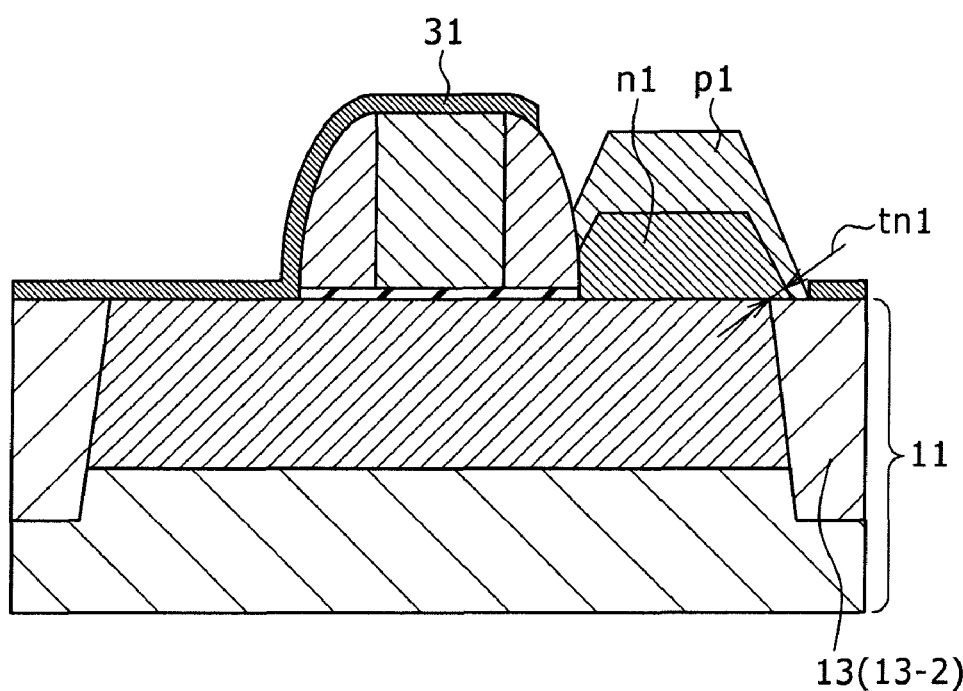
Figure 5A:
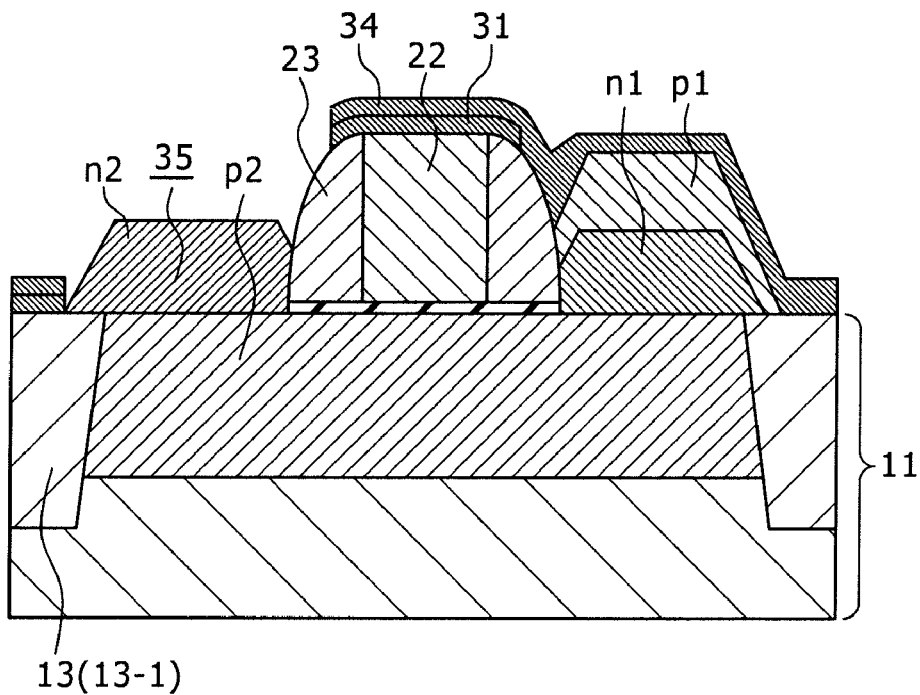
FIGS. 5A and 5B are sectional views showing steps of one embodiment (Example) of the method of manufacturing the semiconductor device of the present invention.
Figure 5B:
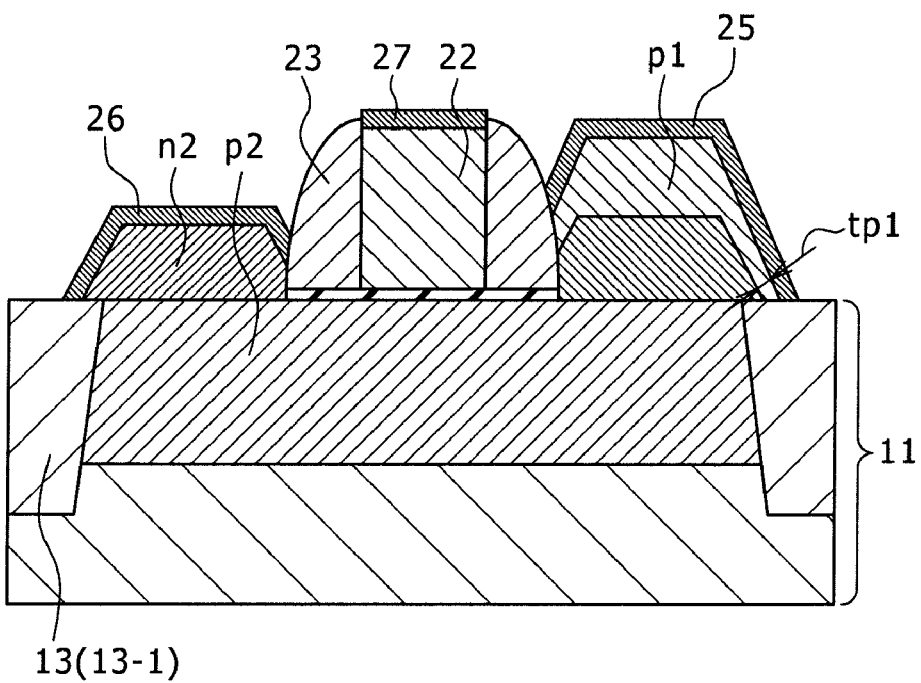
Figure 6:
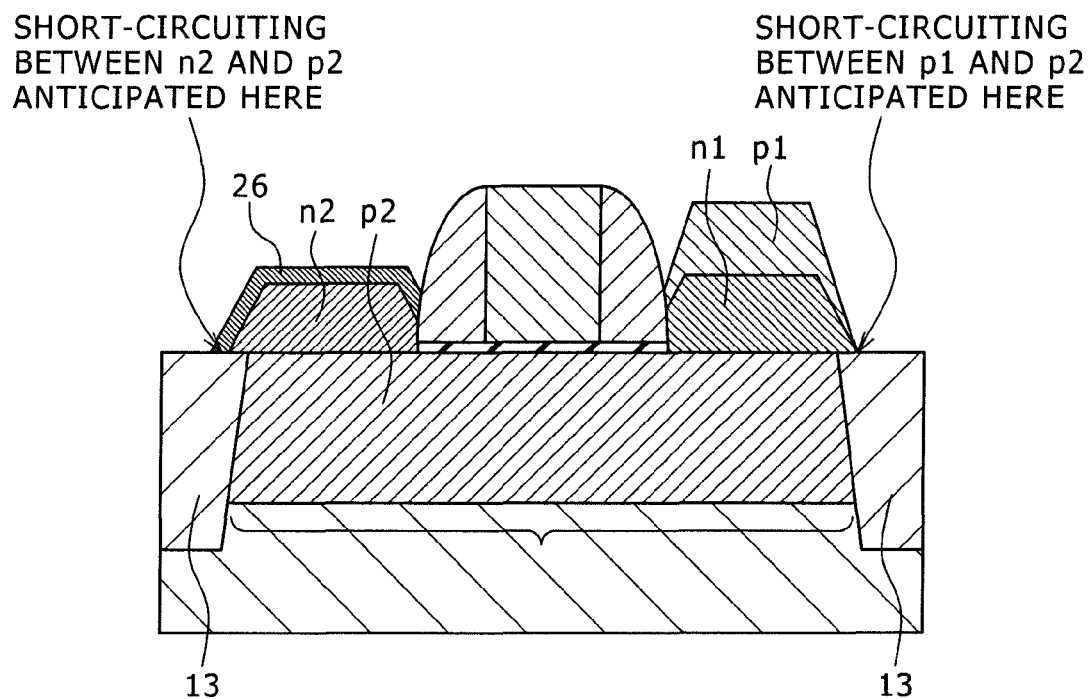
FIG. 6 is a schematic sectional view showing a configuration of a related art semiconductor device.

Next, one embodiment (Example) of the method of manufacturing a semiconductor device of the present invention (first method of manufacturing) will be explained referring to sectional views of FIGS. 3 to 5 showing steps of manufacturing. The first method of manufacturing is an exemplary method of manufacturing the semiconductor device 1 of the first Example of the first semiconductor device.

Figure 3A:
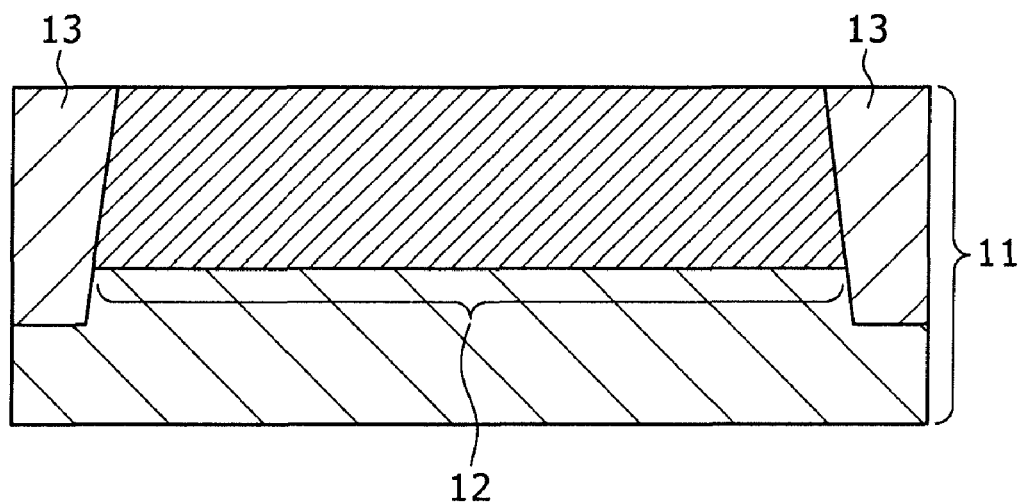
FIGS. 3A, 3B are sectional views showing steps of one embodiment (Example) of the method of manufacturing the semiconductor device of the present invention.

As shown in FIG. 3A, a semiconductor substrate 11 is prepared. A silicon substrate may be used as the semiconductor substrate 11. The element isolation regions 13 for partitioning the element-forming region 12 are formed on the semiconductor substrate 11. The element isolation regions 13 may be formed by a technique, such as LOCOS (local oxidation of silicon), STI (shallow trench isolation), DTI (deep trench isolation) or the like. An n-well region (not shown), for example, may be formed under the element-forming region 12.

Next, the upper portion of the element-forming region 12 of the semiconductor substrate 11 is formed at the first conductivity type (p-type) region. The p-type region will function later as the second p-type region p2 (third region) of the thyristor. Exemplary conditions for the ion implantation may involve use of boron (B) as a p-type dopant, typically at a concentration of $5 \times 10^{18}$ cm$^{-3}$, and more preferably from $1 \times 10^{18}$ cm$^{-3}$ to $1 \times 10^{19}$ cm$^{-3}$ or around. Basically, the concentration is necessarily to be lower than a dopant concentration of the second-conductivity-type (n-type) first n-type region formed later.

Besides boron (B), any other p-type dopant such as indium (In) may be adoptable as p-type dopant. The concentration obtained by using indium may be equivalent to a concentration obtained by using boron.

Figure 3B:
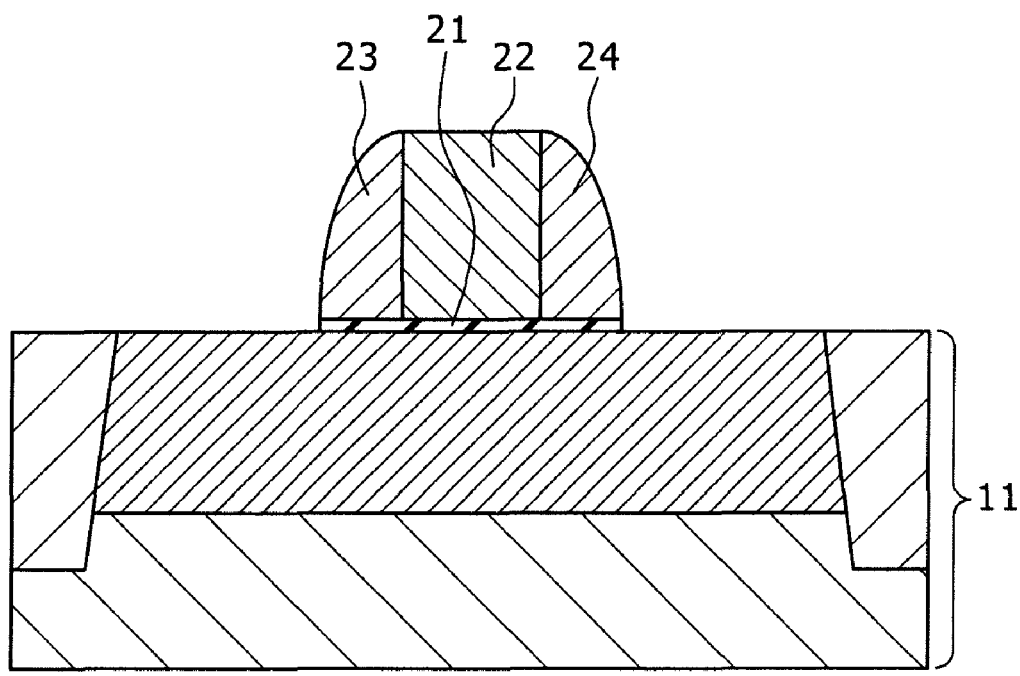

Next, as shown in FIG. 3B, the gate insulating film 21 is formed on the semiconductor substrate 11. The gate insulating film 21 is typically composed of silicon oxide (SiO$_2$) film, to have a thickness around 1 nm to 10 nm. Material composing the gate insulating film 21 is not limited to silicon oxide (SiO$_2$), not to mention silicon oxinitride (SiON), but also materials discussed for adoption to gate insulating film in general CMOS, such as hafnium oxide (HfO$_2$), hafnium oxinitride (HfON), alumina (Al$_2$O$_3$), hafnium silicate (HfSiO), hafnium silicate nitride (HfSiON) and lanthanum oxide (La$_2$O$_3$), may be used.

Next, the gate electrode 22 is formed on the gate insulating film 21. The gate electrode 22 is composed of polysilicon. The gate electrode 22 may also be a metal gate electrode, or may be formed by using silicon germanium (SiGe).

The gate electrode 22 may be formed typically by forming a gate electrode-forming film on the gate insulating film 21, and then processing the gate electrode-forming film by general procedures including resist coating, formation of an etching mask by a lithographic technique, and etching through the etching mask by an etching technique. General dry etching technique may be adoptable to the etching technique. Wet etching may also be adoptable. A silicon oxide film or a silicon nitride film may be formed as a hard mask on the gate electrode-forming film.

Next, the sidewalls 23, 24 are formed on the flank of the gate electrode 22. For example, the sidewalls 23, 24 may be formed on the flank of the gate electrode 22, typically by forming a sidewall-forming film so as to cover the gate electrode 22, and then etching back the sidewalls-forming film.

The sidewalls 23, 24 may be formed using either of silicon oxide or silicon nitride, and even using a stacked film of the both.

Next, the product is annealed for activation typically at 900° C., and then cooled immediately thereafter. For example, spike annealing is carried out typically by heating the product to 900° C., followed by cooling within a time period shorter than 1 second.

Next, as shown in FIG. 4A, a first epitaxial growth mask 31, having an opening 32 formed on the second p-type region p2 of one side of the gate electrode 22, is formed.

In a typical process of forming the first epitaxial growth mask 31, first, a mask-forming film is formed so as to cover the gate electrode 22, the sidewalls 23, 24 and so forth. The mask-forming film may be formed typically by stacking a silicon nitride film to as thick as 20 nm.

A resist mask (not shown) is then formed by general procedures including resist coating and lithographic technique, by having the opening opened above the second p-type region p2 on one side of the gate electrode 22, and also above the joint portion between the one end of the second p-type region p2 and the element isolation region 13 (13-2), and the flank of the sidewall 24, and by use of an etching mask, the first epitaxial growth mask 31 is formed.

As a result of these procedures, a portion of the second p-type region p2 where the first n-type region is formed, is exposed. The opening 32 herein is formed as extending above the joint portion between the one end of the second p-type region p2 and the element isolation region 13 (13-2), and the flank of the one side of the sidewall 24.

In this way, the region other than the region in which epitaxial growth takes place is covered with the silicon nitride film, silicon oxide film and so forth, such as the first epitaxial growth mask 31, the element isolation region 13 and so forth.

A silicon nitride film is used as an example for the first epitaxial growth mask 31, but any other species of insulating film such as silicon oxide, silicon oxinitride and so forth may be adoptable, so far as selectivity in the epitaxial growth may be ensured.

Next, the first n-type region n1 (second region) is formed on the semiconductor substrate 11 (on the second p-type region p2) of the opening 32, by selective epitaxial growth technology using the first epitaxial growth mask 31.

In this process, the first n-type region n1 is formed so that one end thereof covers the joint portion between the one end of the second p-type region p2 and the element isolation region 13 (13-2), and so that the other end of the first n-type region n1 is joined with the flank of the sidewalls 24.

The first n-type region n1 is formed typically to as thick as 100 nm. The thickness of the first n-type region n1 is preferably 50 nm or larger and 300 nm or smaller.

Specific examples of conditions for the selective epitaxial growth allowing the first n-type region n1 to grow laterally also onto the element isolation region 13 (13-2) will now be explained.

A selective epitaxial growth apparatus adoptable herein is typically an epitaxial growth apparatus having a volume of reaction chamber of 5 L to 20 L.

Pressure in the reaction chamber during the epitaxial growth is adjusted to 101.325 kPa, for example.

Temperature of the substrate is adjusted to 750° C. to 800° C., for example.

Gas conditions are typically as follow: dichlorosilane ($SiH_2Cl_2$): 50 cm$^3$/min to 500 cm$^3$/min; phosphine ($PH_3$) (diluted with 1% $H_2$): 5 cm$^3$/min to 200 cm$^3$/min; hydrogen chloride (HCl): 15 cm$^3$/min to 200 cm$^3$/min, and hydrogen ($H_2$): 10 L/min to 30 L/min.

Any other conditions, besides the exemplary conditions described in the above, may be adoptable so far as the epitaxial growth layer doped with an n-type impurity may be formed.

The epitaxial growth may be accomplished also by using a 200-mm, batch-type epitaxial growth apparatus, 300-mm, single-wafer-type epitaxial growth apparatus, or batch-type epitaxial growth apparatus, if the ratio of flow rate of the individual process gasses is appropriately selected within the above-described ranges, depending on volume of the reaction chamber.

The first n-type region n1 may more readily be grown laterally also onto the element isolation region 13 (13-2), if the surface of the element isolation region 13 is composed of silicon nitride ($Si_3N_4$, for example), in place of silicon oxide which is generally used. It may be also effective, for the lateral growth of the first n-type region n1, to eliminate difference in the level of height at the joint portion between the second p-type region p2 and the element isolation region 13 (13-2).

Next, as shown in FIG. 4B, the first p-type region p1 (first region) having a first-conductivity-type (p-type) is formed on the first n-type region n1. The first p-type region p1 may also be formed so that one end thereof is joined with the surface of the element isolation region 13 (13-2).

The first p-type region p1 may typically be formed by selective epitaxial growth, using the first epitaxial growth mask 31, and it is adjusted such that boron (B) concentration in the film becomes $1\times10^{20}$ cm$^{-3}$. The dopant (boron) concentration preferably falls in the range from $1\times10^{18}$ cm$^{-3}$ to $1\times10^{21}$ cm$^{-3}$ or around.

Conditions for the selective epitaxial growth herein may involve use of diborane ($B_2H_6$) gas as a dopant source gas together with a silane-base gas. Substrate temperature during the film formation is adjusted to 750° C. for example, and flow rates of source gases and pressure of epitaxial growth atmosphere is adjusted, and a film thickness is arranged to be 100 nm, for example.

The film thickness is sufficient so far as the first p-type region p1 can function as an anode, although a film thickness in the range from 50 nm to 300 nm or around is preferable.

The gas used for a dopant source may be anything so far as it contains a p-type impurity, and organic sources containing the p-type impurity may also be adoptable.

If necessary, the surface subjected to the epitaxial growth may be cleaned using a chemical solution such as fluorine (HF) or hydrogen ($H_2$) gas.

If necessary, the product may be followed by spike annealing, in which the product is heated for annealing of activation typically at 900° C. or around, and then cooled immediately thereafter, such that the heating at 900° C. is followed by cooling within a period shorter than 1 second. Any conditions may be adoptable so far as they can activate the dopant.

Specific examples of conditions for the selective epitaxial growth of the first p-type region p1 will be explained.

For the selective epitaxial growth apparatus, an epitaxial growth apparatus having a volume of reaction chamber of 5 L to 20 L may be used.

Pressure in the reaction chamber in the process of epitaxial growth is adjusted to 101.325 kPa, for example.

Temperature of the substrate may be adjusted to 750° C. to 800° C., for example.

Gas-related conditions are typically as follow: dicholorosilane ($SiH_2Cl_2$): 50 cm$^3$/min to 500 cm$^3$/min; diborane ($B_2H_6$) (diluted with 1% $H_2$): 5 cm$^3$/min-200 cm$^3$/min; hydrogen chloride (HCl): 15 cm$^3$/min to 200 cm$^3$/min; and hydrogen ($H_2$): 10 L/min to 30 L/min.

Any other conditions, besides the exemplary conditions described in the above, may be adoptable so far as the epitaxial growth layer doped with a p-type impurity may be formed.

The epitaxial growth may be accomplished also by using a 200-mm, batch-type epitaxial growth apparatus, 300-mm, single-wafer-type epitaxial growth apparatus, or batch-type epitaxial growth apparatus, if the ratio of flow rate of the individual process gasses is selected within values of the above-described ranges, depending on volume of the reaction chamber.

In the steps explained referring to FIGS. 4A and 4B, the first n-type region n1 is formed so as to have an effective thickness not smaller than the sum of a depletion layer of the first n-type region n1 generated at the interface between the first p-type region p1 and the first n-type region n1, and a depletion layer of the first n-type region n1 side generated at the interface between the first n-type region n1 and the second p-type region p2. In particular, the first n-type region n1 is formed so that a minimum thickness tn1 thereof, measured from its contact point with the second p-type region p2 to its facet surface, is not smaller than the above-described effective film thickness.

By setting the first n-type region n1 so as to have an effective thickness as described in the above, generation of punch-through from the first p-type region p1 to the second p-type region p2 may be avoidable.

Also short-circuiting between the first p-type region p1 and the second p-type region p2 may be avoidable.

Next, as shown in FIG. 5E, a second epitaxial growth mask 34, having an opening 35 opened on the second p-type region p2 on the other side of the gate electrode 22 is formed.

In a typical process of forming the second epitaxial growth mask 34, first, a mask-forming film is formed so as to cover the first epitaxial growth mask 31, the first p-type region p1 and so forth. The mask-forming film may be formed typically by stacking a silicon nitride film to have a film thickness of 20 nm.

Thereafter, a mask (not shown) composed of a resist, and having an opening opened above the second p-type region p2 on the other side of the gate electrode 22, is formed by general resist coating and lithographic technique, and the mask is then formed into the second epitaxial growth mask 34 having the opening 35 by using the etching. In this etching, the opening 35 is formed also on the first epitaxial growth mask 31. As a consequence, a portion of the second p-type region p2 where the second n-type region n2 is formed, is exposed.

In this way, the region other than the region where epitaxial growth takes place is covered with the silicon nitride film, silicon oxide film and so forth, such as the second epitaxial growth mask 34, the element isolation region 13 and so forth.

The second epitaxial growth mask 34, exemplarily composed of a silicon nitride film in the above, but may be composed of any other species of insulating film such as silicon oxide, silicon oxinitride and so forth, so far as selectivity during the epitaxial growth may be ensured.

Next, the second n-type region n2 (fourth region), composed of an epitaxial growth layer doped with an n-type impurity (phosphorus, arsenic or the like, for example), is formed on the semiconductor substrate 11 (second p-type region p2) exposed of the opening 35, by a selective epitaxial growth technique using the second epitaxial growth mask 34.

In the process of forming the second n-type region n2, the second n-type region n2 is formed so that one end thereof covers the joint portion between the other end of the second p-type region p2 and the element isolation region 13 (13-1), and so that the other end of the second n-type region n2 is joined with the flank of the sidewall 23.

Any gases containing n-type impurity, such as phosphine ($PH_3$), arsine ($AsH_3$) and organic source gases, may be adoptable as the doping gas in the epitaxial growth.

Dopant concentration herein preferably falls in the range from $1\times10^{18}$ cm$^{-3}$ to $1\times10^{21}$ cm$^{-3}$, or around. The film thickness may be sufficient so far as the second n-type region n2 can function as a cathode, although a range from 50 nm to 300 nm is preferable.

Specific examples of conditions for the selective epitaxial growth of the second n-type region n2 will be explained.

For the selective epitaxial growth apparatus, an epitaxial growth apparatus having a volume of reaction chamber of 5 L to 20 L is used.

Pressure in the reaction chamber in the process of epitaxial growth is adjusted to be 101.325 kPa, for example.

Temperature of the substrate may be adjusted to 750° C. to 800° C., for example.

Gas-related conditions are typically as follow: dicholorosilane ($SiH_2Cl_2$): 50 cm$^3$/min to 500 cm$^3$/min; phosphine ($PH_3$) (diluted with 1% $H_2$): 5 cm$^3$/min to 200 cm$^3$/min; hydrogen chloride (HCl): 15 cm$^3$/min to 200 cm$^3$/min; and hydrogen ($H_2$): 10 L/min to 30 L/min.

Any other conditions, besides the exemplary conditions described in the above, may be adoptable so far as the epitaxial growth layer doped with an n-type may be formed.

The epitaxial growth may be accomplished also by using a 200-mm, batch-type epitaxial growth apparatus, 300-mm, single-wafer-type epitaxial growth apparatus, or batch-type epitaxial growth apparatus, if the ratio of flow rate of the individual process gasses is appropriately selected within the above-described ranges, depending on volume of the reaction chamber.

The second n-type region n2 may more readily be grown laterally also onto the element isolation region 13 (13-1), if the surface of the element isolation region 13 is composed of silicon nitride ($Si_3N_4$, for example), in place of silicon oxide which is generally used. It may be also effective, for the lateral growth of the second n-type region n2, to eliminate difference in the level of height at the joint portion between the second p-type region p2 and the element isolation region 13 (13-1).

The second n-type region n2 may also be formed before the formation of the first epitaxial growth mask 31, the first n-type region n1 and the first p-type region p1. In this case, the second epitaxial growth mask 34 may be formed first to form the second n-type region n2, and thereafter the first epitaxial growth mask 31 may be formed to form the first n-type region n1 and the first p-type region p1.

If necessary, formation of either the first p-type region p1 and the second n-type region n2 may be followed by annealing for activation for one or both of the regions. Spike annealing may be carried out as the annealing for activation, typically by heating the product up to 1050° C., followed by cooling immediately thereafter. Conditions for the annealing herein may be sufficient so far as the dopant may be activated.

Next, the first epitaxial growth mask 31 and the second epitaxial growth mask 34 on each region are removed in order to expose the gate electrode 22, the first p-type region p1 and the second n-type region n2. Before an insulating interlayer film (not shown) is formed, as shown in FIG. 5F, the metal silicide layers 25, 26 and 27 are formed on thus-exposed first p-type region p1, second n-type region n2 and side wall gate electrode 22 by the salicide process. The metal silicide layers 25, 26, 27 may typically be composed of titanium silicide, cobalt silicide, or nickel silicide.

The joint portion between the other end of the second p-type region p2 and the element isolation region 13 (13-1) remains covered by one end of the second n-type region n2, even after the metal silicide layers 25, 26 and 27 are formed. The other end of the second n-type region n2 is joined with the sidewall 23.

In order to achieve the formation as described in the above, the second n-type region n2 excluding the region where the metal silicide layer 26 is formed is arranged to have a film thickness of not smaller than a depletion layer of the second n-type region n2 side generated at the interface between the second n-type region n2 and the second p-type region p2.

The width of the depletion layer may be determined by the equation (1) in the above.

By virtue of formation of the second n-type region n2 in this way, short-circuiting between the second n-type region n2 and the second p-type region p2 caused via the metal silicide layer 26 may be avoidable.

In addition, in order to avoid short-circuiting between the first p-type region p1 and the first n-type region n1 caused via the metal silicide layer 25 formed on the surface of the first p-type region p1, the first p-type region p1 is formed so as to ensure an effective thickness tp1 in the foot portion on the facet surface of the n-type region n1, after the metal silicide layer 25 is formed.

By virtue of this configuration, short-circuiting between the first p-type region p1 and the first n-type region n1 caused via the metal silicide layer 25 may be avoidable.

Thereafter, an insulating interlayer film is formed, and wiring processes are carried out similarly to as in general CMOS process.

In the above-described method of manufacturing a semiconductor device, short-circuiting between the metal silicide layer 26 and the second p-type region p2 is difficult to be occurred, because the second n-type region n2 is formed in the process of formation thereof so that one end thereof covers the joint portion between the other end of the second p-type region p2 and the element isolation region 13 (13-1), and the other end of the second n-type region n2 is joined with the flank of the sidewall 23 of the other side, and because the joint portion between the other end of the second n-type region n2 and the element isolation region 13 (13-1) remains covered by the second n-type region n2 even after the metal silicide layer 26 is formed on the surface of the second n-type region n2.

Also short-circuiting between the first p-type region p1 and the second p-type region p2 is not tend to be occurred, because the first n-type region n1 is formed in the process of formation thereof so that one end thereof covers the joint portion between the one end of the second p-type region p2 and the element isolation region 13 (13-2), and so that the other end of the first n-type region n1 is joined with the flank of one side of the sidewall 24, and because the first p-type region p1 and the second p-type region p2 are consequently parted by the first n-type region n1 and the element isolation region 13 (13-2), even if the first p-type region p1 is formed so as to extend onto the element isolation region 13 (13-2), one end of the first n-type region n1 covers the joint portion between the one end of the second p-type region p2 and the element isolation region 13 (13-2).

Moreover, generation of punch-through from the first p-type region p1 to the second p-type region p2 may be avoidable, because the first n-type region n1 may be formed so as to have an effective film thickness not smaller than the sum of a depletion layer of the first n-type region n1 side generated at the interface between the first p-type region p1 and the first n-type region n1, and a depletion layer at the first n-type region n1 side generated at the interface between the first n-type region n1 and the second p-type region p2.

As a consequence, under the present invention, it is possible to manufacture a semiconductor device having, formed therein, a thyristor having the first p-type region p1 (first region), the first n-type region n1 (second region), the second p-type region p2 (third region) and the second n-type region n2 (fourth region) sequentially arranged to form junctions, capable of obtaining normal characteristics, more specifically capable of ensuring functions of the junction between the first p-type region p1 and the first n-type region n1, the junction between the first n-type region n1 and the second p-type region p2, and the junction between the second p-type region p2 and the second n-type region n2.

It should be understood by those skilled in the art that various modifications, combinations, sub-combinations and alterations may occur depending on design requirements and other factors insofar as they are within the scope of the appended claims or the equivalents thereof.

The present document contains subject matter related to Japanese Patent Application No. 2007-326967 filed in the Japanese Patent Office on Dec. 19, 2007, the entire content of which being incorporated herein by reference.

What is claimed is:

1. A semiconductor device comprising:
a thyristor in which a first-conductivity-type first region, a second-conductivity-type second region having a conductivity type reverse to the first conductivity type first region, a first-conductivity-type third region, and a second-conductivity-type fourth region are arranged to form junctions, wherein;
the third region is formed on a semiconductor substrate separated by an element isolation region; and
a gate electrode formed over a gate insulating film and a side wall formed adjacent the gate electrode, and
the fourth region is formed so that one end thereof covers a joint portion between the third region and extends beyond the joint portion and the other end of the fourth region is joined with the sidewall, wherein the fourth region excluding a portion where a metal silicide layer is formed, has a thickness equal to or larger than a film thickness of a depletion layer at the fourth region side generated at the interface between the fourth region and the third region, wherein the second region has a film thickness not smaller than the sum of a depletion layer of the second region side generated at the interface between the first region and the second region, and a depletion layer of the second region side generated at the interface between the second region and the third region.

2. The semiconductor device as claimed in claim 1, wherein the second region is formed so that one side thereof covers a joint portion between the one side of the third region and the element isolation region.

3. A method of manufacturing a semiconductor device having a thyristor composed of a first-conductivity-type first region, a second-conductivity-type second region having a conductivity type reverse to the first conductivity type first region, a first-conductivity-type third region, and a second-conductivity-type fourth region arranged to form junctions, the method comprising:
forming an element isolation region in a semiconductor substrate;
forming the third region adjacent the element isolation region;
forming a gate electrode above the third region with a gate insulating film therebetween, and forming a sidewall at a side of the gate electrode;

forming the second region on the third region at one side of the gate electrode;

forming the first region on the second region; and forming the fourth region on the third region on the other side of the gate electrode, wherein;

the fourth region is formed so that one side thereof covers a joint portion between the third region and extends beyond the joint portion and the other side of the fourth region is joined with the sidewall, wherein the second region has a film thickness not smaller than the sum of a depletion layer of the second region side generated at the interface between the first region and the second region, and a depletion layer of the second region side generated at the interface between the second region and the third region.

4. The method of manufacturing a semiconductor device as claimed in claim 3, further comprising forming a metal silicide layer on a surface of the first region, on a surface of the fourth region, and on the gate electrode, wherein;

after the metal silicide layer is formed, the fourth region remains so that one side thereof covers a joint portion between the third region and the element isolation region.

5. The method of manufacturing a semiconductor device as claimed in claim 3, wherein in the step of forming the second region, the second region is formed so that one end thereof covers a joint portion between the third region and the element isolation region.

6. A semiconductor device comprising:

a thyristor in which a first-conductivity-type first region, a second-conductivity-type second region having a conductivity type reverse to the first conductivity type first region, a first-conductivity-type third region, and a second-conductivity-type fourth region are arranged to form junctions, wherein;

the third region is formed on a semiconductor substrate separated by an element isolation region; and a gate electrode formed over a gate insulating film and a side wall formed adjacent the gate electrode, and the fourth region is formed so that one end thereof covers a joint portion between the third region and the element isolation region and the other end of the fourth region is joined with the sidewall, and wherein the fourth region extends beyond the joint portion.

7. A method of manufacturing a semiconductor device having a thyristor composed of a first-conductivity-type first region, a second-conductivity-type second region having a conductivity type reverse to the first conductivity type first region, a first-conductivity-type third region, and a second-conductivity-type fourth region arranged to form junctions, the method comprising:

forming an element isolation region in a semiconductor substrate;

forming the third region adjacent the element isolation region;

forming a gate electrode above the third region with a gate insulating film therebetween, and forming a sidewall at a side of the gate electrode;

forming the second region on the third region at one side of the gate electrode;

forming the first region on the second region; and forming the fourth region on the third region on the other side of the gate electrode, wherein;

the fourth region is formed so that one side thereof covers a joint portion between the third region and the element isolation region and the other side of the fourth region is joined with the sidewall, and wherein the fourth region extends beyond the joint portion.

* * * * *